United States Patent [19]

Burns et al.

[11] Patent Number: 5,303,161

[45] Date of Patent: Apr. 12, 1994

[54] TECHNOLOGY INDEPENDENT INTEGRATED CIRCUIT MASK ARTWORK GENERATOR

[75] Inventors: Richard J. Burns, Canyon Country; Stacy W. Mehranfar, Thousand Oaks, both of Calif.

[73] Assignee: Hughes Aircraft Company, Los Angeles, Calif.

[21] Appl. No.: 624,958

[22] Filed: Dec. 10, 1990

[51] Int. Cl.$^5$ ............................................. G06F 15/60
[52] U.S. Cl. ................................... 364/490; 364/489; 364/488
[58] Field of Search ................. 364/488, 489, 490, 491

[56] References Cited

U.S. PATENT DOCUMENTS

| | | | |
|---|---|---|---|
| 3,617,714 | 11/1971 | Kernighan et al. | 364/488 |
| 3,653,071 | 3/1972 | Hill et al. | 364/490 |
| 4,495,559 | 1/1985 | Gelatt, Jr. et al. | 364/491 |
| 4,593,363 | 6/1986 | Burstein et al. | 364/491 |
| 4,613,940 | 9/1986 | Shenton et al. | 364/490 |
| 4,613,941 | 9/1986 | Smith et al. | 364/490 |
| 4,630,219 | 12/1986 | DiGiacomo et al. | 364/490 |
| 4,815,003 | 3/1989 | Putatunda et al. | 364/491 |
| 4,922,432 | 5/1990 | Kobayashi et al. | 364/490 |
| 4,967,367 | 10/1990 | Piednoir | 364/490 |
| 5,005,136 | 4/1991 | Van Berkel et al. | 364/490 |
| 5,031,111 | 7/1991 | Chao et al. | 364/491 |
| 5,038,294 | 8/1991 | Arakawa et al. | 364/491 |

*Primary Examiner*—Vincent N. Trans
*Attorney, Agent, or Firm*—Charles D. Brown; Randall M. Heald; Wanda K. Denson-Low

[57] ABSTRACT

An integrated circuit mask artwork generator (10) is disclosed which can define relationships between individual components and which is also independent of the technology chosen. An artwork library database (58) is provided which contains macros each macro being capable of generating artwork for one of the electrical components of the particular technology type. A device generator (18) is provided for defining the type of circuit to be executed and for executing the macro for that circuit independent of the component's particular technology type. A means for defining relationships between the circuits (16) is provided with the relationships specified desirable physical relationships between sets of related circuit components. In conjunction with the schematic this provides a schematic with relationship annotations (14). A means for determining placement of the components (20) is provided which includes a means for determining the placement groups where the groups consist of groups of components with related placements based on the defined relationships. In addition, the system (10) includes a means for arranging the components (20) so as to optimize a predetermined parameter. The means for determining placement (20) also eliminates overlaps between the components by moving the groups as a whole so as to preserve defined relationships. Finally, a router (22) routes the electrical connections between the placed components.

13 Claims, 3 Drawing Sheets

TECHNOLOGY INDEPENDENT INTEGRATED CIRCUIT MASK ARTWORK GENERATOR

BACKGROUND OF THE INVENTION

1. Technical Field

This invention relates to systems for generating integrated circuit mask artwork, and particularly to systems of this type which are technology independent.

2. Discussion

The digital computing revolution has, to a large measure, been driven by advances in semi-conductor technology. In particular, the availability of inexpensive, but powerful, integrated circuits has made it possible to bring computing power to the fingertips of the masses. Since the materials of which integrated circuits are constructed, (primarily silicon) are relatively inexpensive, and manufacturing processes are highly automated, design and development costs comprise a large part of their total cost. In response, a number of automated systems have been developed to facilitate the integrated circuit design process.

For example, once an electrical schematic is designed defining the required electrical components and their interconnections, much effort goes into the process of determining how to arrange the individual components and their interconnections so that they could be constructed using integrated circuit manufacturing techniques. At the high densities of today's integrated circuits sometimes a million devices may be placed on a single chip. Current manufacturing techniques involve the generation of mask artwork from the schematic. These masks are then used in the photo lithographic process involving successive layers of semi-conductor material to construct the integrated circuit.

In order to facilitate mask artwork generation a number of products have been developed which automate various stages of artwork generation. For example, a commonly used interactive computer program for device level artwork generation is known as a polygon editor, such as the system sold at one time by the Calma Company. However, the polygon editor still required manual placement and interconnection of components. Placement relationships between components were either communicated between the schematic author and draftsman or the program relied upon the knowledge and experience of the draftsman. Unfortunately, this form of editing is tedious, slow and error prone. With a polygon editor devices are entered one layer at a time and it is up to the user to make sure that design rules are not violated. While software has been developed to assist in catching such errors these errors must be manually corrected in an iterative process that is very slow.

Another form of automated artwork generation programs are called cell level automated routing programs. These programs work with circuits made of previously generated subcircuits, or cells, and they route interconnections between cells based on the number of interconnections and the physical dimensions of the component cells. They are used typically on very large scale integration (VLSI) digital circuits which consist of previously edited cells of logic gates which are fixed.

However, very serious constraints are placed on the designer with cell level automated routing. For example, all pins or routing points must be on a grid. Also, a metal interconnect cannot run through the middle of a cell because it might hit some metal that is inside the cell since the system does not have any knowledge of where metal may be inside the cell. Cell level automated routing works well for technology like logic circuits where the performance is not critical and where there are very stable fixed components. However, these programs have no provision for routing device (transistor, resistor, capacitor) level circuits and have no mechanism for relating devices with others for placement.

As a consequence, while digital logic circuits can benefit by cell level automated routing programs, such programs could not be used for integrated circuits such as high performance digital and linear circuits, where the predetermined cells cannot be used and individual device level circuits must be routed and related to each other. This is because the physical relationships between individual devices can determine critical parameters including offset, accuracy, and in some cases, speed. That is, in digital circuits parameters such as offset do not exist since the circuits generate either one or zero states.

In contrast, in analog circuits the accuracy of the value of a signal that a circuit produces with respect to a specified value is important, and is radically affected by many factors such as the matching of components. Matching of components refers to how closely the components are manufactured in terms of their parameters. For example, the parasitic capacitance of a particular component may be one of the parameters that affects the circuit performance and, in an analog or high speed circuit, the circuit designer may be trying to match the parasitics of two devices so that they are as similar as possible since they cannot be controlled otherwise. One way to achieve this is to put the devices as close to each other on the circuit because, due to normal processing variations there are gradients running across the chip. That is, the thickness of layers will vary slightly across the chip. For this reason, for closely spaced components, the variation will be very small but if these components were widely spaced the variation could be significant.

In other cases, it may be desired to have these effects between two components cancel each other out. In such cases these devices may be placed in a mirroring orientation to provide cancelling. In addition to the effect of thickness gradients across the chip, skew between the different mask layers when the components are generated may introduce other effects. In such cases, the orientation of the device might change the parameters of the device necessitating mirroring or matching as the case may be.

For these reasons, linear and high speed bipolar digital (e.g. ECL) designers are forced to use polygon editors to design integrated circuit mask artwork, with the inherent slowness and errors inherent in this process. One exception is a group of programs known as silicon compilers, or cell synthesizers. Some of these programs have the ability to produce linear circuits with intelligent component level placement. For example, see L. R. Carley, et al., "ACACIA: The CMU Analog Design System" IEEE 1989 Custom Integrated Circuits Conference, as well as the product, "AUTO-LINEAR" sold by Silicon Compiler Systems Corporation. However, these silicon compilers suffer from two serious limitations. First, they are specifically designed for linear CMOS integrated circuit processes, a small subset of the process technologies available. Second, they do not allow arbitrary annotation of relationships between devices. That is, these programs require the user either to select a known circuit topology (with known layout constraints) or to group related components into subcells with known layout constraints (i.e., differential pairs, etc.). These limitations effectively prevent the use of these silicon compilers for state of the art circuit designs which do not conform to past circuit topologies.

Thus, it would be desirable to have a system which facilitates the generation of integrated circuit mask artwork and permits the designer to relate devices on a component level, without requiring extensive manual input. Further, it is desirable to have a system for automating integrated circuit mask artwork generation which is useful for high performance digital and linear circuits. In addition, it would be desirable to have such a system that reduces the time required for developing integrated circuit mask artwork for high performance digital and linear integrated circuits which is independent of device technology and circuit topology.

SUMMARY OF THE INVENTION

Pursuant to the present invention a system for generating integrated circuit mask artwork is disclosed. The system works from a schematic of a circuit which contains electrical components and electrical connections between these components. An artwork library database is provided which contains macros, each macro being capable of generating artwork for one of the electrical components of a particular technology type. The components are identified by a component designator. A device generator is provided for defining the type of circuit to be executed and for executing the macro for that circuit independent of the component's particular technology type. Also a means for defining relationships between the circuits is provided where the relationships specify desirable physical relationships between sets of related circuit components. These relationships, in conjunction with the schematic, provides a schematic with relationship annotations. Further, a means for determining placement of the components on the artwork is provided which includes a means for determining the placement groups where the groups consist of groups of components with related placements based on the defined relationships. In addition the system includes a means for arranging the components so as to optimize a predetermined parameter. Also a means for eliminating overlaps between the components is provided which moves the groups as a whole so that defined relationships are preserved. Finally, a means for routing the electrical connections between the placed components is provided.

In accordance with another aspect of the present invention, a method is provided for generating integrated circuit mask artwork from a schematic. The method consists of generating an artwork library database containing macros, each of which generate artwork for one of the electrical components on the schematic of a particular technology type. The components are identified by a component designator. Next, the type of circuit to be executed is defined and the macro is executed by a device generator for that circuit independent of the component's particular technology type. Next, relationships are defined between the circuits. These relationships specify desirable physical relationships between sets of related circuit components. For example, these relationships may define matched, or mirrored components. Next, placement is determined by first determining placement groups where the groups consist of groups of components with related placements based on the o defined relationships. Next, components are arranged so as to optimize a predetermined parameter. Then, overlaps are eliminated between the components by moving the groups as a whole wherein the defined relationships are preserved. Finally, the step of routing is performed to provide electrical connections between the placed components.

The system thus provides a technology independent method and means for generating integrated circuit mask artwork, which permits the designer to specify relationships on the component level as required in the design of high speed digital and linear circuits. Also, the system is technology independent.

BRIEF DESCRIPTION OF THE DRAWINGS

The various advantages of the present invention will become apparent to one skilled in the art by reading the following specification and by reference to the following drawings in which.

DESCRIPTION OF THE PREFERRED EMBODIMENT

Figure 1:
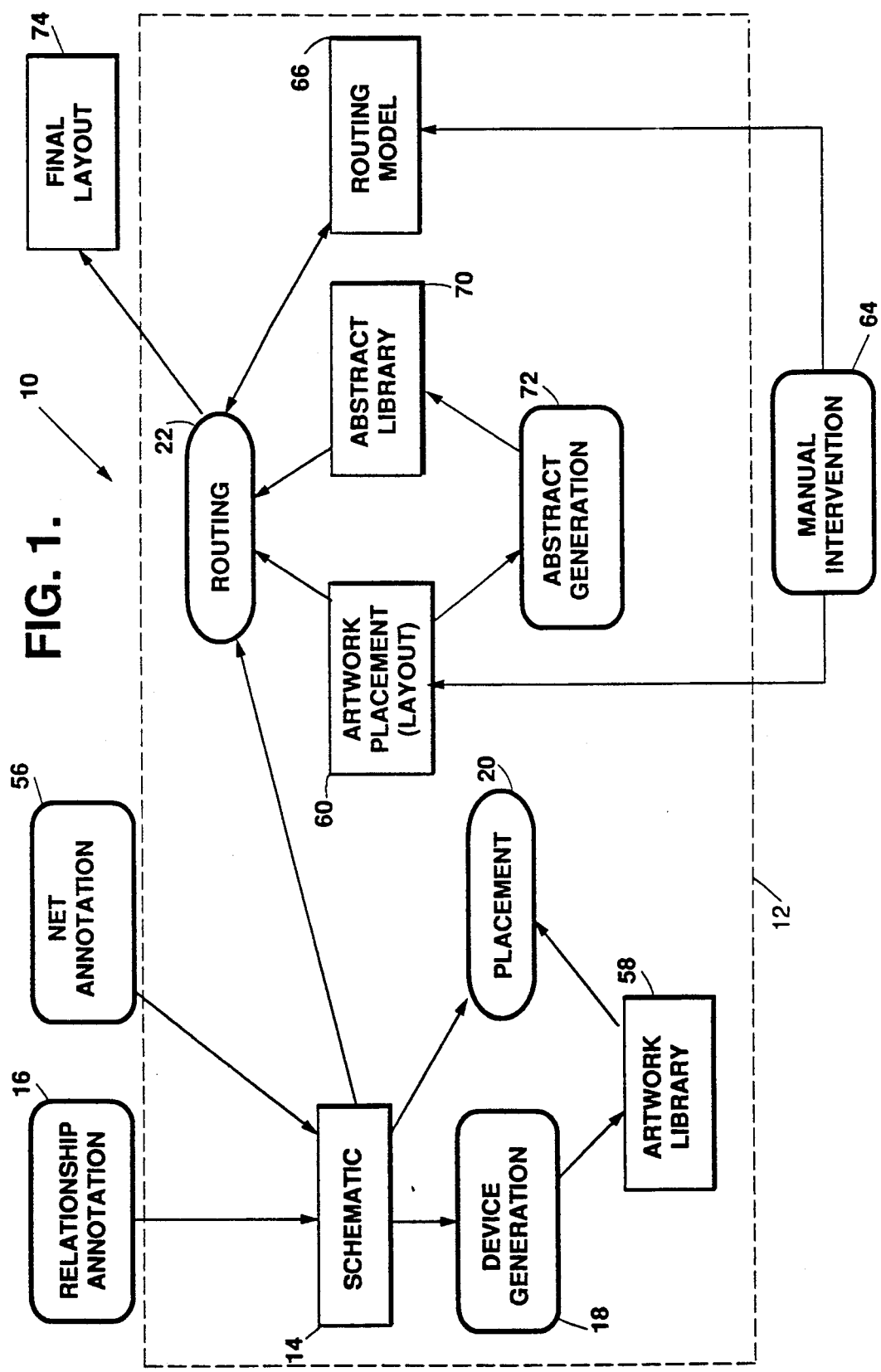
FIG. 1 is a block diagram of the artwork generator in accordance with the present invention.
Figure 2:
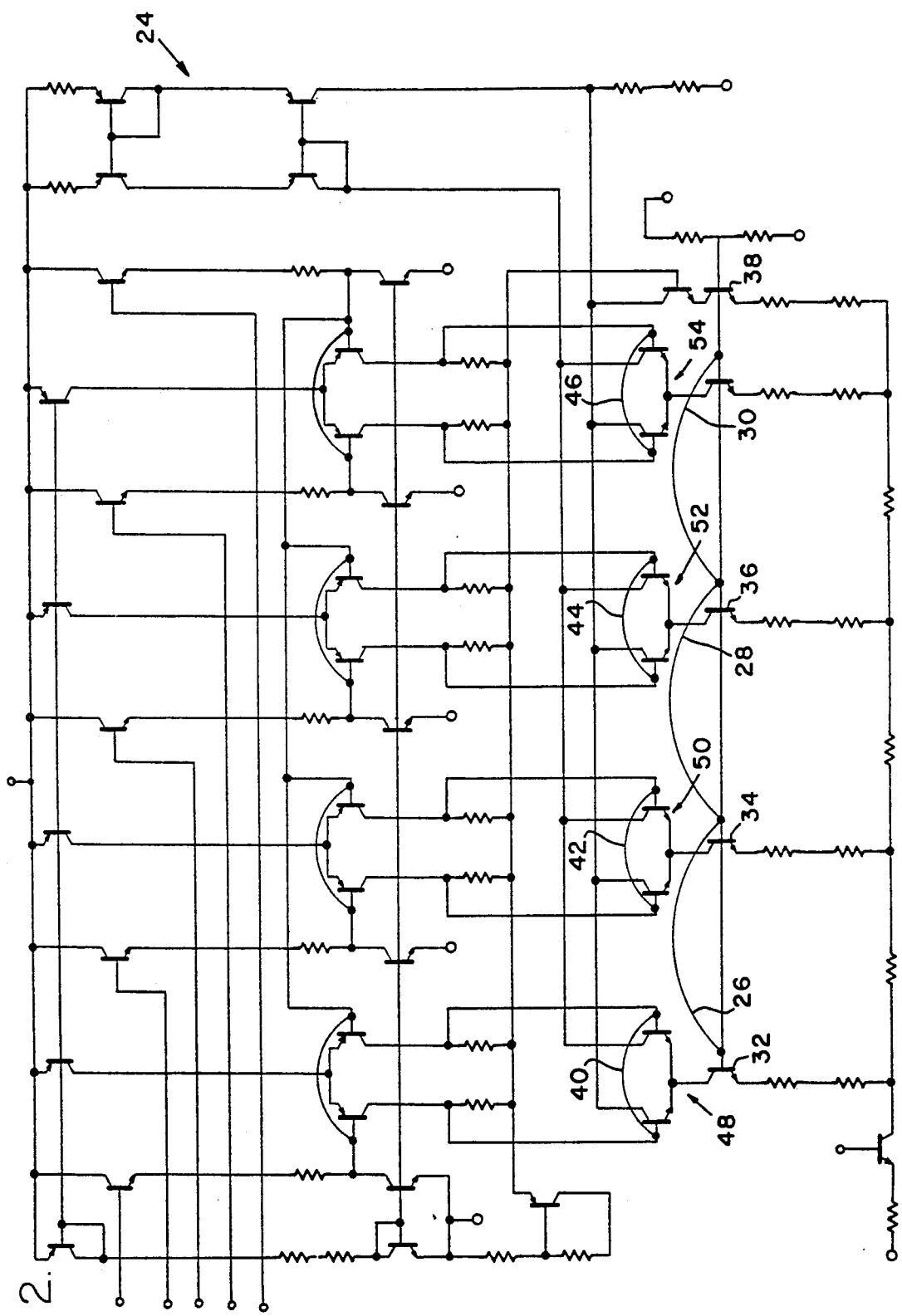
FIG. 2 is an example of a schematic diagram with relationship annotations used in accordance with the present invention.
Figure 3:
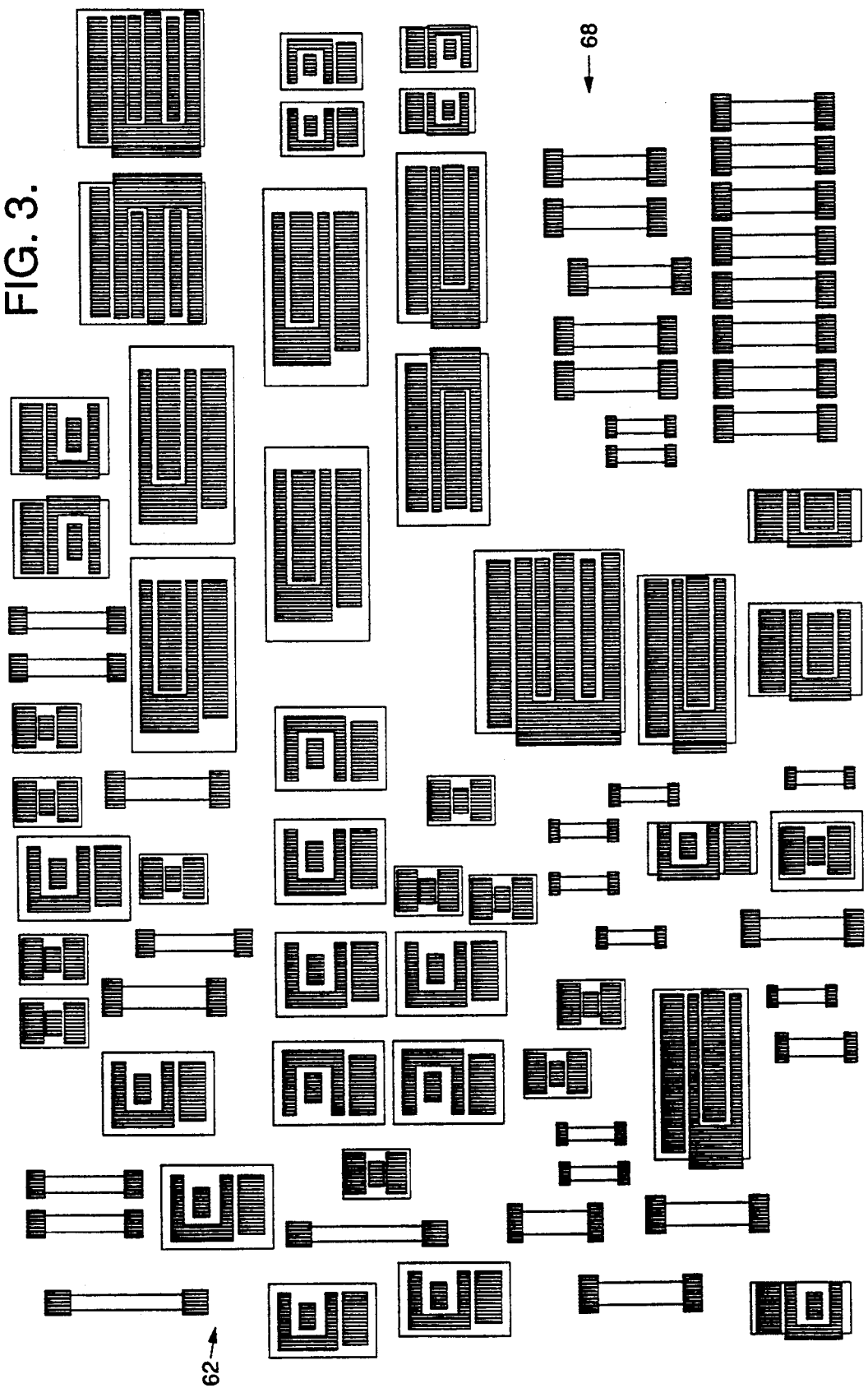
FIG. 3 is an example of artwork placement developed in accordance with the present invention shown in FIG. 1.

Referring now to FIG. 1 there is shown a technology independent integrated circuit mask artwork generator 10 in accordance with the present invention. The artwork generator 10 consists of an interactive software system for generating integrated circuit artwork from an annotated schematic. FIG. 2 illustrates an example of one such annotated schematic, while FIG. 3 illustrates an example of an integrated circuit artwork placement. A schematic, such as the one shown in FIG. 2 minus the annotations is initially input into a computer system 12.

Computer system 12 may comprise, for example, a microprocessor based workstation, such as an Apollo DN4500 or Sun Spacestation equipped with a video display screen, keyboard and mouse to facilitate interactive use of the artwork generator 10 by the user. The schematic 14 will reside in memory in the computer 12. The artwork generator system 10 includes four major functional steps: 1) relationship annotation 16; 2) device generation 18; 3) placement 20; and 4) routing 22.

Relationship annotation 16 permits the user to specify various relationships between individual circuit components to optimize the performance of the integrated circuit being designed. For example, the user may desire to specify a "matching" relationship annotation on the schematic. Referring to the annotated schematic 24 in FIG. 2, three large arcs 26, 28 and 30 are seen connecting four transistors 32, 34, 36 and 38. These arcs 26, 28 and 30 labeled "matches" indicate that it is desired for transistors 32, 34, 36 and 38 to have a matching relationship. This may be desirable, for example, where the output of these transistors should be as similar as possible to achieve the required performance of the circuit 24. To achieve this matching, it is desired to have each of these transistors 32, 34, 36 and 38 have the same orientation and be physically close to each other. This will avoid, for example, having the thickness of the layers varying from component to component due to normal gradients across the integrated circuit.

Alternatively it may be desired to have individual devices in a mirroring relationship. For example, four arcs 40, 42, 44 and 46 labeled "mirrors" connect pairs of transistors 48, 50, 52 and 54 respectively. This annotation will require these pairs of transistors to be in a mirroring relationship that is reflected about the X or Y axis and to be physically nearby. This may be used, for example, where it is desirable to have the effects of errors in each of the devices cancelled by the corresponding mirrored device.

A third possible annotation, (not shown in FIG. 2), is to permit layout orientation (rotated in multiples of 90° or reflected and rotated) of any components or objects to be fixed. This may be useful in the case, for example, where the circuit 24 shown in FIG. 2 comprises a subcircuit of a larger circuit. If devices between different subcircuits need to match or mirror then the fixed annotation can be established between the subcircuits. It will be appreciated that this permits artwork to be generated independently, in a hierarchial fashion. Thus only a small easily understood circuit has to be dealt with by the user at a time as the user builds up these circuits in a hierarchial fashion. If he needs to have devices matched throughout the hierarchy then the orientation of these devices can be fixed using the relationship annotation function 16. It will be appreciated that relationship annotation 16 is completely independent of circuit topology and of process technology (e.g., CMOS, bipolar, etc.).

Net annotation 56 permits nets, or the interconnections between individual devices on the schematic to be annotated also. For example, it may be desirable to annotate which nets are critical and which should be the shortest. Another parameter that could be annotated is current, which is a function of the width of the route. Also part of net annotation function 56 is the specification of what layers it is desired to have the nets routed on. In general, net annotation 56 is done after relationship annotation 16 and is done with a view to adding parameters that will yield a reliable circuit as opposed to merely connecting the components together.

The relationship annotation 16 and net annotation 56 functions are performed by the user interactively with the computer 12 of the artwork generator system 10. In this way, these annotations are added to the schematic 14.

The next step is device generation 18. The device generation function acts as a driver for a set of user-defined macro routines to identify and/or generate artwork for circuit components. It will be appreciated that macros are software subroutines and in this case, each macro is stored in the artwork library and is capable of generating integrated circuit mask artwork for an individual circuit component. The user specifies the name of the macro for each type of circuit component (e.g., transistor, resistor, capacitor, etc.). The device generation function 18 then determines the type of each object from its schematic reference designator. This designator may be, for example, an "R" for resistors. The device generation program 18 then executes the appropriate macro. In this way, the device generation function 18 acts as an interface from the schematic 14 to the device generating macros stored in the artwork library 58 The schematic reference designators are generic for the type of circuit component and are not dependent on the type of circuit technology. That is, a resistor can be called up by the device generation function 18 using the designator "R" regardless of whether the macros in the artwork library are executing the circuit component in CMOS, ECL, NMOS, etc. In this way, to use the artwork generator system 10 for a given technology, the artwork library 58 must be loaded with macros for the desired technology. Consequently, all functions of the artwork generator 10 are independent of the technology chosen. The macro functions may simply map schematic symbol names to artwork in the artwork library 58 or, alternatively, they may generate the artwork using structures and geometries from any technology.

The next function, placement 20, reads the annotated schematic 14 and also reads the artwork devices in the artwork library 58 generated by the device generation function 18. The placement function 20 then assembles these two into the artwork placement layout 60. The placement function 20 provides the user with a choice of two different algorithms: pair-linking, and schematic position. Pair-linking in general is based on interconnect costs while schematic position is based on positions as drawn in the schematic.

PAIR LINKING

Step 1

The choice of the placement function algorithm will be based on the user's goals in designing the circuit. For example, pair-linking will be chosen where it is desired to have the lowest total area for a given set of components or objects. This is because the pair-linking algorithm in the process of minimizing connectivity costs will minimize the distance between objects. On the other hand, the schematic position algorithm will be preferred in circuits such as high performance circuits where the density is not critical. In such cases the designer will gladly give up area for better performance. Thus, in the schematic position algorithm the relative location of components are considered at the expense of maximizing density. Relative position is important because it is known that subtle layout information is contained in an analog schematic. This is because the circuit designer will put things on the schematic in their natural related form, so that related components are generally put near each other on the schematic. Thus, if the schematic is used as a template it often gives a good placement layout. For example, the schematic position algorithm will calculate a position of a device to be directly below another device if it is directly below that device in the schematic. In pair-linking, on the other hand, the algorithm will only consider the closest permissible position for the device without regard to whether it was below or above on the original schematic. In more detail, the pair-linking algorithm comprises four main steps. Initially the pair-linking algorithm will build a connectivity matrix representing the connection "cost" of each object (electrical component) with every other object. The user specifies criticality values for each net in the schematic. Nets are the conductive paths connecting an object to other objects. In addition the user may specify a net size parameter to give higher costs to nets with larger or smaller numbers of terminals.

The connectivity matrix, for example, may comprise a matrix having all of the nets on one axis and all of the device terminals in the entire circuit on the other axis. An X, or 1, or a cost value then will be placed at each point in the matrix indicating that a particular net is connected to a specific device terminal. The cost function is based on numerous factors that are specified by the user. For example, the length of the routing is one factor. Also, some factors are additive and some are multiplicative. Certain priorities which are placed on the annotated schematic by the net annotation function 56 may have multiplicative factors. That is, a high multiplier may be added to a net link for a specific net, so that if the net was placed with a large rout, the cost function would go up very rapidly. As a result, the system will then try to minimize the cost function, and this high cost net would be one of the first things it would try to drive down.

Another example of a cost factor would be with regard to the layer that is used. That is, high resistance layers may have a higher cost than low resistance layers. This will affect the density because as densities are driven higher and higher more and more layers are used which will force the use of higher cost layers. This results in trading distance off against the cost of additional layers.

Step 2

Next the algorithm orders the objects according to their connection costs. First, the object with the largest cost is selected. The next object selected is the unordered object with the highest cost. This process is repeated until all objects are ordered. The goal of this step is to reduce the overall cost so that the system is ordering objects to generate the lowest possible cost by changing the order.

At each step, ties are broken by looking ahead a user-specified number of steps. That is, the system explores a number of possible placement variations based on where the system is at and the system tries to reduce the cost by looking at the highest cost objects to see if there is something it can do to reduce that cost. It should be noted that placement is a relative term so that once a component is placed, then everything else is placed in a position relative to that one component. It will be appreciated that this step involves a large number of computations since the number of possible ordering of objects is large.

Step 3

Determine placement groups. Steps 1 and 2 in general are based on well known minimal routing placement algorithms. Step 3 intervenes in the standard cost function by adding the relationship annotations developed in function 16 to the cost function. Relationships are given a relatively high cost so that if the algorithm attempts to break up a relationship the high cost associated with that will eliminate that possibility.

Placement groups are determined based on relationship annotations. Each group is a set of related objects. For example, grouped objects may be related by matching or mirroring. Step 3 extracts information from the annotated schematics as to which components are related to each other. One way to do this is to add a database item called a "property" to each component that is related and then to scan all the components and look for the property that indicates they are related to something else. Part of the information in the property is what component they are related to and what their relationship is. This step then eliminates some of the possible orderings determined in Step 2 by putting an extremely high cost on object orders that violate the relationships indicated in the annotated schematic. In sum, Step 3 introduces relationship annotations as an additional cost in the cost function utilized in Steps 1 and 2.

Step 4

Position the objects. Objects are positioned so that annotated relationships are satisfied, overlaps are eliminated and connectivity cost is minimized. In particular, for each object in the ordering found in Step 2, first the placement group in which the object is a member is determined. A target position is computed for each object in the group by computing the weighted average of the coordinates of the placed objects to which it is connected. Objects are then positioned so that their relationships are satisfied and they are near the target position. To eliminate overlaps, the group as a whole is moved so that relationships are not disturbed.

The system iterates through the results of Steps 2 and 3 until the lowest cost function is found. That is, relationships are satisfied, overlaps eliminated and connectivity costs is minimized. There will always be a minimum cost but the value of the minimum cost will vary from circuit to circuit. Overlaps refer to the requirement that each object occupy a separate position in two-dimensional space without overlapping each other. For example, if there are two related objects and the system is trying to place a third the system is going to try to put it in between those two rather than on one end, to minimize the connectivity cost. This is the result of using the weighted average of the coordinates.

At this point, in the pair-linking algorithm the routing function 22 will be executed.

SCHEMATIC POSITION

Alternatively, the schematic position algorithm may be used instead of pair-linking. The schematic position algorithm involves three basic steps.

Step 1

Determine Placement Groups. Placement groups are determined in a similar fashion as in Step 3 of the pair-linking algorithm.

Step 2

Order the Groups by Decreasing Layout Area. The ordering here is different from ordering in Step 2 of the pair-linking algorithm in that only groups are ordered. All the objects are not being ordered so there is much less computation involved at this stage. Further, rather than considering a cost function decreasing total layout area is considered.

Step 3

Position the Groups. This positioning is done in a similar manner as in Step 4 of the pair-linking algorithm except that the target position is calculated based on its position in the schematic, instead of using the weighted average of the coordinates of the placed objects to which it is connected.

FIG. 3 illustrates an example of an artwork placement 62 generated in accordance with the present invention. Prior to the routing function 22 the manual intervention function 64 permits manual changes to be made to the artwork placement layout 62 shown in FIG. 3. Manual intervention is important because computer systems in general are not good at making spatial judgments in the way that people can. Thus, for example, a user may be able to make some minor change that will greatly simplify the routing. For example, as shown in FIG. 3 a group of five identical circuit elements 68 are shown with the middle element out of alignment. Such misalignments are commonly found to result from automatic placement systems. However, a user will easily see this situation and, by using manual intervention 64, can simply line up the middle component to greatly simplify the interconnect to prevent the necessity of jogging the wires to connect to that device.

Once the placement function 20 has generated the artwork placement layout 60 based on either the pair-linking or schematic position algorithms, and manual intervention has been completed on the artwork placement, the next step is for the routing function 22 to route all the conductive lines between objects or components. There are two basic ways routing can be accomplished. First, it can be done with polygons, that is, routes having width. Due to the space needed to route in this manner, spaces between components are adjusted along the way. This method is quite slow however. A preferred method is to conduct a first phase of the routing having zero width lines so that all the routing is completed first and then later objects are moved apart, one at a time, to make room for the routing widths. This process can be done with a commercially available program known as a "compactor". The routing model will be selected according to the routing model 66 in FIG. 1.

As shown in FIG. 1, manual intervention can be introduced not only to the artwork placement 60 but also to the routing model 66. There are a number of situations in which manual intervention can greatly simplify routing paths. For example, while the routing function 22 does attempt most possible routing paths it may miss a simple path that would be obvious to the user. Or the user may realize that shifting something very slightly may avoid the necessity of a number of changes of layers.

Before the routing function 22 begins the objects are replaced with user defined routing representations. These representations are stored in the abstract library 40 70 which is generated by the abstract generation function 72. These abstract representations in the abstract library 70 may, for example, have pins (connection points for the router) of any size and shape on any routing layers. Thus, for example, the object representations shown in FIG. 3 in the layout 62 are simplified to simply replace these representations with the minimum information needed for routing. The geometry details shown in FIG. 3 are eliminated and simply the boundary box for the device and the terminal locations and sizes are necessary for routing. Also the abstract routing representations define routing obstructions of arbitrary shape on any routing layer.

Once the routing function 22 is done, it replaces those simplified versions with the complete artwork as shown in FIG. 3.

The devices are generally at the lowest layers, with the metal routing layers at successively higher layers. The router will route over a device if it can; that is, if the device does not contain any metal where it is routing in metal. However, the user can specify blockages which will prevent routing over a particular device. The routing function 22 can be used to route all nets, individual nets or nets above or below specified weights. Critical nets are weighted in the net annotation 56.

For example, in a critical such as high speed path it is desired to have the most direct, shortest and cleanest route. Since nets routed last will typically have the longest and least direct path to where they are going since they have to go around everything else that is already laid down, the critical paths should be routed first. To order the nets, therefore, the critical paths will be given a high weight in the net annotation 56 to specify that they should be routed earlier in the process. Nets are ordered primarily by weight and next by estimated net length among nets of equal weight.

In accordance with a preferred embodiment of the present invention the routing function 22 uses a modified maze-expansion algorithm. It will be appreciated that maze-expansion algorithms or routing algorithms are well known and act much like they are working their way through a maze trying to get from point A to point B avoiding all the obstacles and trying each possible path. If the system gets to a dead end it backs up to the last place it made a decision and tries another path, and keeps backing up until it gets to where it is going. This process includes changing layers as allowed. A penalty for changing layers can be added with weights to minimize the vias required between layers. Also, the routing function 22 permits manual intervention 64 to interactively rip up and reroute selected nets as desired by the user.

Once the routing function is complete the final layout 74 is generated, which consists of the artwork placement 62 shown in FIG. 3 will all the routing added. This final layout 74 thus consists of the artwork necessary to proceed with the next stage of manufacturing the integrated circuit which may consist, for example, of building the masks defined by this artwork. Thus it can be seen that by means of the artwork generator 10 in accordance with the present invention a means for generating integrated circuit mask artwork that is independent of the chosen technology has been disclosed. While permitting manual intervention where desired, the artwork generator 10 greatly speeds up and automates the process of generating artwork for high performance digital and linear circuits where it is necessary to specify critical layout details on the component level.

Those skilled in the art can appreciate other advantages that can be obtained from this invention and that modification can be made without departing from the true spirit of the invention after studying the specification, drawings, and following claims.

What is claimed is:

1. A system for generating integrated circuit mask artwork from a schematic of an electrical circuit, said electrical circuit containing electrical components and connections between said components, said system comprising:

artwork library database containing macros, each of which generate artwork for one of said electrical components of a particular technology type, wherein said components are identified by a component designator;

device generator means for defining the type of circuit to be executed and for executing the macro for that circuit independent of the component's particular technology type;

means for defining relationships between said circuits, said relationships specifying desirable physical relationships between sets of related circuit components which influence their performance;

means for determining placement of said components on said artwork including means for determining placement groups, the groups consisting of groups of components with related placements based on said defined physical relationships;

means for arranging said components so as to optimize a predetermined parameter, the parameter being a function of the physical relationship between the components;

means for eliminating overlaps between said components by moving said groups as a whole wherein said defined relationships are preserved; and means for routing the electrical connections between said placed components.

2. The system of claim 1 wherein said means for defining relationships defines matched, and mirrored components.

3. The system of claim 1 wherein said predetermined parameter is a connectivity cost based on predetermined features including connection length and wherein said means for determining placement includes:

means for building a connectivity matrix representing the cost of connecting each component with the other components to which its connected, said cost being a function of predetermined factors including connection length;

means for ordering the components according to their connection costs;

means for trying out various possible placements of said components starting with the components having the highest cost and arranging all other components at a position relative to that component, and their determining the total placement cost;

means for repeating the arrangement of components starting with the next higher cost component in said ordering until the arrangement with the lowest total cost is determined; and means for placing components within each placement group according to the weighted average of the coordinates of the placed objects to which it is connected to minimize the distance between said components within said group.

4. The system of claim 1 wherein said predetermined parameter is total layout area, and wherein said means for determining placement includes:

means for ordering said placement group according to decreasing layout area;

means for positioning the group so that components are in the same relative positions as in the schematic; and means for placing components within a group so that components are in the same relative position as in the schematic.

5. The system of claim 1 wherein said means for routing includes:

means for creating abstract representations of each component; and means for determining a routing weight for each connection between said components wherein said means for routing, routes components having higher weights first.

6. The system of claim 1 wherein said means for routing includes a zero width routing means for routing said interconnections as if said interconnections had no width, and a compactor means for moving components apart after routing to create sufficient space for these interconnections.

7. A system for generating integrated circuit mask artwork from a schematic of an electrical circuit, said electrical circuit containing electrical components and connections between said components, said system comprising:

artwork library database containing macros, each of which generate artwork for one of said electrical components of a particular technology type, wherein said components are identified by a component designator;

device generator means for defining the type of circuit to be executed and for executing the macro for that circuit independent of the component's particular technology type;

means for defining relationships between said circuits, said relationships specifying matched and mirrored relationships between sets of related circuit components;

means for determining placement of said components on said artwork including means for determining placement groups, the groups consisting of groups of components with related placements based on said defined relationships, means for building a connectivity matrix representing the cost of connecting each component with the other components to which its connected, said cost being a function of predetermined factors including connection length;

means for ordering the components according to their connection costs;

means for trying out various possible placements of said components starting with the components having the highest cost and arranging all other components at a position relative to that component, and their determining the total placement cost;

means for repeating the arrangement of components starting with the next higher cost component in said ordering until the arrangement with the lowest total cost is determined;

means for placing components within each placement group according to the weighted average of the coordinates of the placed objects to which it is connected to minimize the distance between said components within said group;

means for arranging said components so as to optimize a predetermined parameter;

means for eliminating overlaps between said components by moving said groups as a whole wherein said defined relationships are preserved; and means for routing the electrical connections between said placed components.

8. A method for generating integrated circuit mask artwork from a schematic of an electrical circuit, said electrical circuit containing electrical components and connections between said components, said method comprising:

generating an artwork library database containing macros, each of which generate artwork for one of said electrical components of a particular technology type, wherein said components are identified by a component designator;

defining the type of circuit to be executed and executing the macro for that circuit independent of the component's particular technology type;

defining relationships between said circuits, said relationships specifying desirable physical relationships between sets of related circuit components which influence their performance;

determining placement of said components on said artwork including the step of determining placement groups, the groups consisting of groups of components with related placements based on said defined physical relationships;

arranging said components so as to optimize a predetermined parameter, the parameter being a function of the physical relationship between the components;

eliminating overlaps between said components by moving said groups as a whole wherein said defined relationships are preserved; and routing the electrical connections between said placed components.

9. The method of claim 8 wherein said step of defining relationships defines matched, and mirrored components.

10. The method of claim 8 wherein said step of arranging optimizes a predetermined connectivity cost parameter based on predetermined features including connection length and wherein said step of determining placement includes the steps of:

building a connectivity matrix representing the cost of connecting each component with the other components to which its connected, said cost being a function of predetermined factors including connection length;

ordering the components according to their connection costs;

trying out various possible placements of said components starting with the components having the highest cost and arranging all other components at a position relative to that component, and their determining the total placement cost;

repeating the arrangement of components starting with the next higher cost component in said ordering until the arrangement with the lowest total cost is determined; and placing components within each placement group according to the weighted average of the coordinates of the placed objects to which it is connected to minimize the distance between said components within said group.

11. The method of claim 8 wherein said predetermined parameter is total layout area, and wherein said step of determining placement includes the steps of:

ordering said placement group according to decreasing layout area;

positioning the group so that components are in the same relative positions as in the schematic; and placing components within a group so that components are in the same relative position as in the schematic.

12. The method of claim 8 wherein said means for routing includes creating abstract representations of each component; and determining a routing weight for each connection between said components, wherein said means for routing, routes components having higher weights first.

13. The method of claim 8 wherein said step of routing includes the step of routing said interconnections as if said interconnections had no width, and compacting by moving components apart after routing to create sufficient space for these interconnections.

* * * * *